Dec. 2, 1969 L. D. GLEASON 3,482,166

MULTI-FREQUENCY RECEIVER WITH AUTOMATIC MONITORING OF CHANNELS WITH ONE CHANNEL HAVING PRIORITY

Filed May 29, 1967 2 Sheets-Sheet 1

Inventor
LAWRENCE DAVID GLEASON
BY
Mueller, Aichele & Rauner
ATTYS.

Inventor
LAWRENCE DAVID GLEASON

BY
Mueller, Aichele & Rauner

ATTYS.

United States Patent Office 3,482,166

Patented Dec. 2, 1969

3,482,166

MULTI-FREQUENCY RECEIVER WITH AUTOMATIC MONITORING OF CHANNELS WITH ONE CHANNEL HAVING PRIORITY

Lawrence David Gleason, Schiller Park, Ill., assignor to Motorola, Inc., Franklin Park, Ill., a corporation of Illinois Filed May 29, 1967, Ser. No. 641,970
Int. Cl. H03d *7/16*
U.S. Cl. 325—341 10 Claims

ABSTRACT OF THE DISCLOSURE

Switching system for receiver with plurality of local oscillators for operating on different channels for rendering the oscillators operative in turn, and having starting circuit for initially operating a given oscillator. The switching system is latched when a carrier is received to hold the receiver on the channel having the carrier. One channel may be designated the priority channel and the oscillator therefor is operated at recurring short periods when another channel is being received to continually sample the priority channel and lock thereon in response to a carrier on such channel.

BACKGROUND OF THE INVENTION

Multiple frequency reecivers having switching apparatus for selecting tuning elements to provide reception on a plurality of different channels are known. Ring counter switching apparatus can be used but must actuate a single tuning element when initially energized.

Automatic switching from one channel to another to find a channel having a carrier wave is also known. In some applications it is desired to continually sample one priority channel so that any signals there will be received, and such sampling should continue during operation on another channel. However, suitable systems for providing such priority operation have not been available.

SUMMARY OF THE INVENTION

It is an object of the present invention to provide a multi-frequency superheterodyne receiver operable on a plurality of channels, with a simple switching system for causing initial operation on a particular channel and then selecting the channels in turn, and which is disabled when a carrier is received.

Another object of this invention is to provide a channel switching system for a multi-frequency receiver which continuously monitors a priority channel even during reception of another channel, and wherein there is an indication of the channel being received.

The receiver of the invention has a plurality of local oscillators for providing oscillations of different frequencies so that carriers on different channels are received. A switching circuit including silicon controlled rectifiers selectively renders the oscillators operative and a starting circuit with an additional silicon controlled rectifier which causes only one oscillator to operate initially. A pulsing circuit is connected to trigger circuits for the silicon controlled rectifiers so that they are rendered conducting in turn. A signal from the receiver indicating the reception of a carrier, which may be the squelch circuit of the receiver, disables the pulsing circuit so that the receiver remains operative on the channel on which the carrier is received. To extend priority to a particular channel, a sampling circuit causes the silicon controlled rectifier for actuating that channel to be intermittently operated when another channel is received. When a carrier is then received on the priority channel, the receiver will remain tuned to the priority channel. Indicator lights are provided to indicate operation of the oscillator for the individual channels. The indicator lights are gated on only when a carrier is received to indicate reception on the selected channel.

DETAILED DESCRIPTION OF PREFERRED EMBODIMENTS

Figure 1:
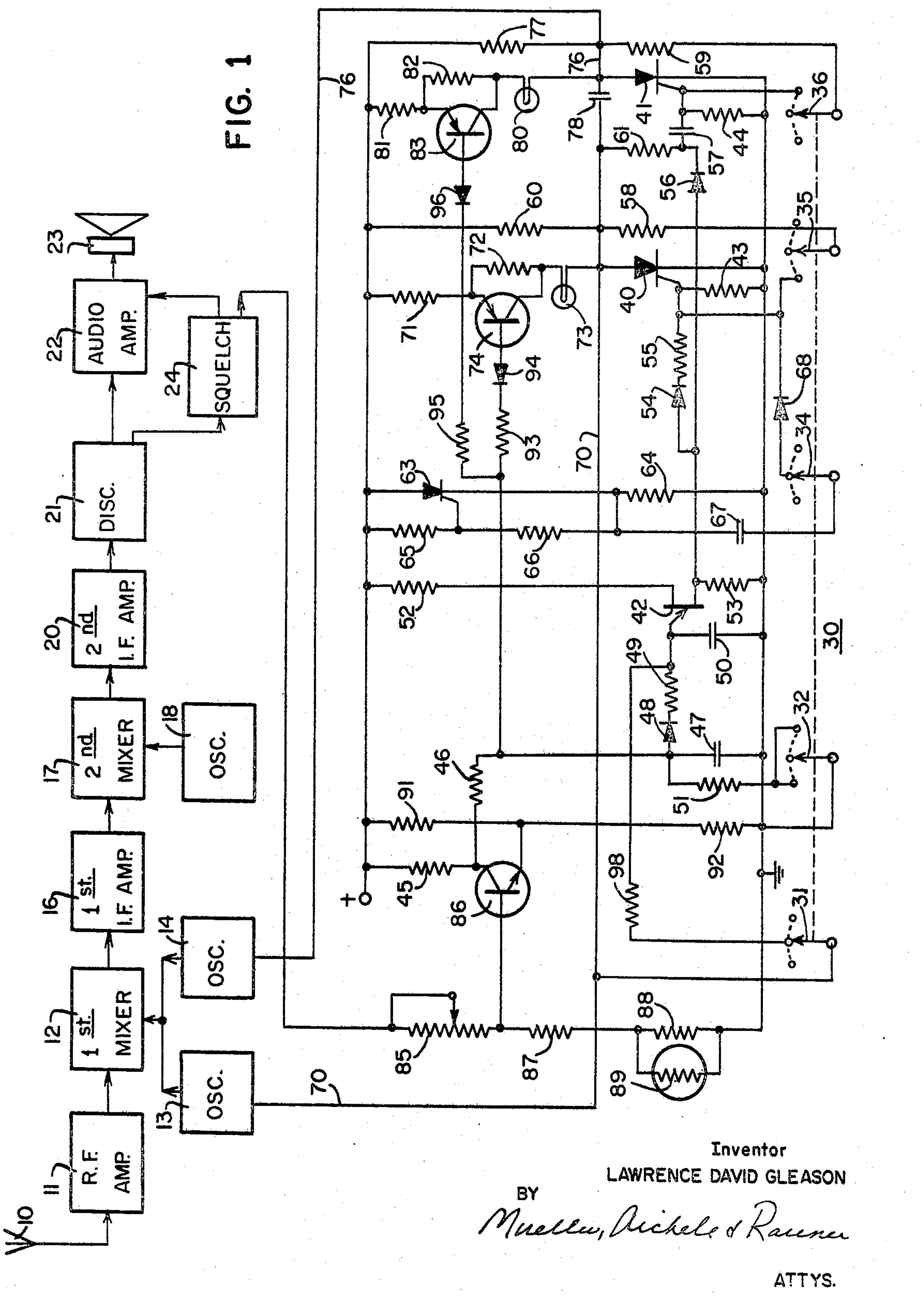
FIG. 1 is a schematic diagram of the system of the invention with the receiver shown in block diagram form and the channel selecting and priority circuit shown in circuit diagram form.

FIG. 1 illustrates a receiver of the superheterodyne type wherein signals are received by antenna 10, amplified by radio frequency amplifier 11 and applied to first mixer 12. The output frequency of the first mixer is controlled by the local oscillations supplied thereto selectively by local oscillators 13 and 14. The output of the first mixer is applied through first intermediate frequency amplifier 16 and from there to second mixer 17 to which local oscillations are applied by oscillator 18. The output of the second mixer is applied to second intermediate frequency amplifier 20 and the modulation is derived from the signal by the discriminator 21. The audio modulating signal is amplified in audio amplifier 22 and reproduced by loudspeaker 23. The squelch circuit 24 selectively renders the audio amplifier 22 operative when a carrier wave is received. It is pointed out that the receiver can be used for the reception of signals other than voice signals and the various stages which have been described can be of various different known constructions.

The oscillators 13 and 14 are rendered operative when a ground is applied thereto. This is applied through the automatic switching and sampling system to be described. The switch 30 controls the operation of the circuit and has a plurality of contact banks 31, 32, 34, 35 and 36. When the switch is in the left position, oscillator 13 is grounded and when the switch is in the right position oscillator 14 is grounded. When the switch is in the center position, the automatic scanning and priority operation takes place.

The oscillators 13 and 14 are grounded by conduction of silicon controlled rectifiers 40 and 41 respectively. These rectifiers are rendered conducting by pulses applied to the gate or control electrodes thereof. Pulses are applied thereto from pulsing circuit including unijunction transistor 42. Potential is applied through resistors 45 and 46 to charge capacitor 47, and the potential across capacitor 47 is applied through diode 48 and resistor 49 to charge capacitor 50 which is connected to the emitter of the unijunction transistor 42. When the potential across capacitor 50 reaches a predetermined value, the transistor 42 will conduct to provide current flow through resistors 52 and 53. A voltage pulse will therefore be developed across resistor 53 which is applied through diode 54 and resistor 55 to the gate of silicon controlled rectifier 40, and through diode 56 and capacitor 57 to the gate of silicon controlled rectifier 41. To block the action of diode 56 when the system starts and pulses are simultaneously applied to the silicon controlled rectifiers 40 and 41, positive voltage applied through resistors 60 and 61 holds the dicde 56 cut off so that the initial pulse is applied only to silicon controlled rectifier 40. When this rectifier conducts, the anode therefor is brought to ground potential so that the bias applied to diode 56 through resistor 61 is removed.

To insure that an adequate pulse is applied to the rectifier 40 to turn it on when the system starts, an auxiliary circuit is provided including silicon controlled rectifier 63 connected in series with resistor 64 across the power supply potential. Resistors 65 and 66 are connected across the anode and cathode of the silicon controlled rectifier 63 to supply a potential to the gate thereof to render the same conducting. When the rectifier 63 conducts, the potential across resistor 64 increases rapidly to provide a pulse which is applied through capacitor 67, switch contact 34 and diode 68 to the gate of silicon controlled rectifier 40. The diode 68 acts to prevent the application of a noise pulse from the positive supply line to the gate of silicon controlled rectifier 40 through rectifier 63 and capacitor 67. This could cause the rectifiers 40 and 41 to conduct simultaneously to disrupt the scanning action. The diode 68 reduces such a pulse by an amount such that the possibility of triggering rectifier 40 by noise is substantially eliminated. The voltage drop across diode 68 is small compared to the pulse applied during starting and therefore does not interfere with starting.

When the silicon controlled rectifier 40 conducts, the anode thereof is at ground potential to apply a ground through conductor 70 to the oscillator 13. This applies the supply potential across resistor 60 and through the parallel path including resistors 71 and 72 and lamp 73. Resistor 72 has a value to limit the current through the lamp 73 so that illumination is very low. Transistor 74 is connected across resistor 72 to short the same so that the lamp 73 is highly illuminated. The operation of the transistor 74 will be explained later.

When the unijuction transistor 42 fires, capacitor 50 will be discharged. This capacitor will then again charge from the voltage across capacitor 47 so that recurring pulses will be produced across resistor 53. The next pulse will render silicon controlled rectifier 41 conducting to ground the conductor 76 and apply the supply potential across resistor 77. Capacitor 78 which has charged through resistor 77 when rectifier 40 conducts, will now discharge to reduce the current flow through rectifier 40 so that it is rendered non-conducting. Lamp 80 will be energized through resistors 81 and 82. Transistor 83 when conducting will short resistor 82 to permit the lamp 80 to be highly illuminated.

The next pulse across resistor 53 will cause rectifier 40 to conduct and capacitor 78 will reverse charge to reduce the current through rectifier 41 so that it will cut off. Resistors 43 and 44 connected between the gates of silicon controlled rectifiers 40 and 41 respectively and ground reduce the sensitivity of the gates of these rectifiers. This makes the firing action of the rectifiers more uniform and prevents both rectifiers from turning on simultaneously at high temperatures.

When the energized oscillator causes reception on a channel on which a carrier is present, the squelch circuit of the receiver 24 will provide a voltage through resistor 85 to the base of transistor 86. The base is grounded through resistors 87, 88 and thermistor 89 which divide the voltage and control the level at which the transistor 86 conducts. The emitter potential for transistor 86 is determined by resistors 91 and 92 connected across the power supply. When transistor 86 conducts, the potential at the collector is reduced so that the voltage applied to charge condenser 47 is reduced to a level insufficient to cause operation of the unijunction transistor 42. Accordingly, switching pulses will not be applied and the silicon controlled rectifier 41 which is conducting will remain conducting as long as the carrier is received. When the carrier terminates, the squelch voltage will terminate so that transistor 86 will turn off and the voltage applied to capacitor 47 will charge the same to a value sufficient to render unijunction transistor 42 conducting.

The potential at the collector of transistor 86 is also applied through resistor 46 and through resistor 93 and diode 94 to the base of transistor 74, and through resistor 95 and diode 96 to the base of transistor 83. When a carrier is received, the reduced potential applied to the base of transistors 74 and 83 will render the same conducting in the event that the silicon controlled rectifier 40 or 41, respectively, completes the circuit thereto. Accordingly, when a carrier is received, the lamp connected to the conducting silicon controlled rectifier 40 or 41 will be illuminated to indicate the channel which is being received.

In a particular system it may be desired to afford priority to one of the channels, such as the channel selected by oscillator 13. In such case, when a carrier is continuously received by the channel selected by oscillator 14, it is necessary to intermittently sample oscillator 13 to check for the presence of a carrier. To provide such operation, resistor 98 is connected through switch contact 31 to conductor 70. When rectifier 41 is conducting and rectifier 40 has been cut off, conductor 70 is connected through resistor 60 to the positive potential and this positive potential is applied through resistor 98 to charge capacitor 50. Accordingly, unijunction transistor 42 will conduct after a period of time required for capacitor 50 to charge through resistor 98, to produce a pulse across resistor 53 which will cause silicon controlled rectifier 40 to conduct. This will cause the oscillator 13 to operate so that the receiver samples the priority channel. If no carrier is received, the squelch circuit 24 will provide no signal to the transistor 86 so that capacitor 47 will charge through resistors 45 and 46 to operate the unijunction transistor 42 and a pulse will be applied to render silicon controlled rectifier 41 conducting again. This intermittent sampling operation provides monitoring of the priority channel during the presence of a continuous carrier on the other channel.

When the switch 30 is in the left or right position to directly actuate the oscillator 13 or 14, respectively, the contact level 32 connects resistor 51 in parallel with capacitor 47 so that the voltage thereacross is too low to cause operation of the unijunction transistor 42. This prevents the pulsing action of the system. When the switch 30 is at the left position, contact level 35 connects resistor 58 between the anode and gate of silicon controlled rectifier 40. This causes the rectifier 40 to conduct so that conductor 70 is grounded and oscillator 13 is rendered operative. Light 73 will be illuminated as transistors 74 and 83 are conducting because the voltage applied to the base electrodes thereof is dropped by connection of resistor 51. Similarly, when the switch 30 is in the right position, contact level 36 will connect resistor 59 between the anode and gate of silicon controlled rectifier 41 to render this rectifier conducting so that conductor 76 is grounded and oscillator 14 is rendered conducting. Light 80 will be illuminated under these conditions to indicate which channel is operative.

Figure 2:
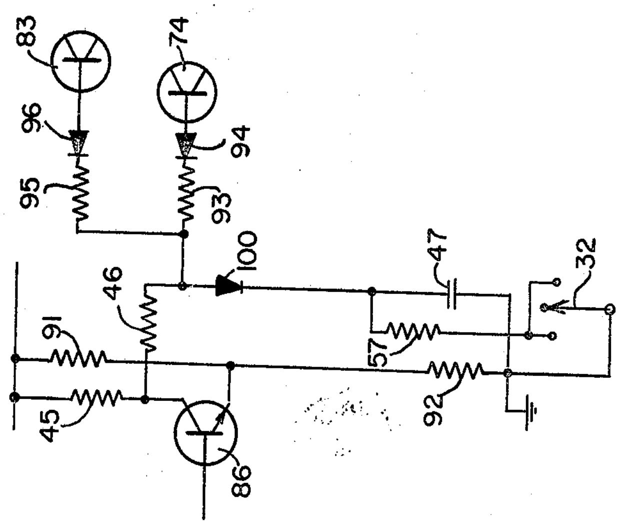
FIG. 2 illustrates a modification of the system of FIG. 1.

By the connection of a diode 100 between the junction of resistors 46, 93 and 95 and the junction of resistor 51 and diode 48, as shown in FIG. 2, the circuit for actuating lights 73 and 80 can be isolated from the resistor 51. In such case the lights will be operated in response to operation of the receiver squelch circuit to indicate the reception of a signal on the connected channel during manual selection, as during automatic selection.

Figure 3:
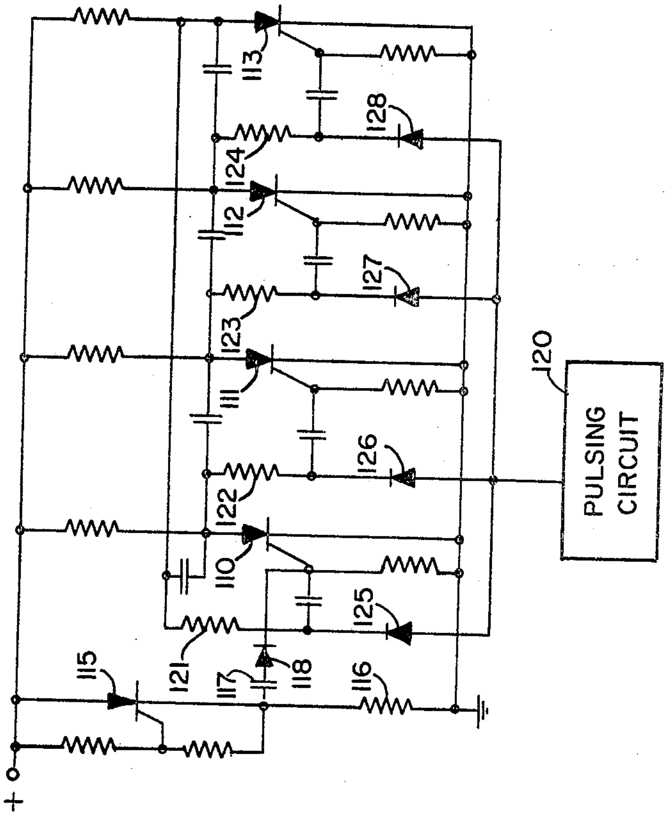
FIG. 3 is a circuit diagram of a second embodiment of the switching system of the invention.

The invention has been described in connection with FIG. 1 for a switching system wherein one of two stages is selectively rendered operative. The switching system is basically a ring counter and can have any number of stages more than one. In FIG. 3 there is illustrated a modification of the switching system having four stages including silicon controlled rectifiers 110, 111, 112 and 113. Each stage of the system is essentially the same as in FIG. 1.

The circuit of FIG. 3 like the circuit of FIG. 1 has the advantage that when the system is first energized a particular stage will always be rendered conducting. This is the stage including silicon controlled rectifier 110. When the system is first turned on, silicon controlled rectifier 115 of the starting circuit will be rendered conducting to provide a pulse across resistor 116 which is applied through capacitor 117 and diode 118 to the gate of silicon controlled rectifier 110.

The stages of the circuit will be energized in turn by pulses applied thereto by circuit 120, which can be a unijunction transistor circuit as illustrated in FIG. 1. Application of pulses from the pulsing circuit 120 will initially be blocked at all of the stages because the supply voltage is applied through resistors 121, 122, 123 and 124 to hold the coupling diodes 125, 126, 127 and 128, respectively, cut off. When the rectifier 110 conducts through action of the starting circuit, the voltage at its anode will drop so that the voltage applied through resistor 122 to the diode 126 connected to the gate of rectifier 111 is likewise reduced and this diode is only slightly non-conducting. Then the next pulse from the pulsing circuit 120 will cause this diode to conduct to apply a pulse to the gate of the silicon controlled rectifier 111 to render it conducting. The other diodes 125, 127 and 128 will be non-conducting because the resistors 121, 123 and 124 are connected to silicon controlled rectifiers which are not conducting and the anode voltage thereof will be the full supply voltage. When rectifier 111 conducts, the voltage at its anode will drop so that the voltage applied through resistor 123 to diode 127 will drop and this diode can conduct on the next pulse. This circuit will permit only the rectifier connected to the starting circuit to conduct initially, and then only the next rectifier in sequence can conduct in response to the switching pulses.

The switching system of the invention has been found to be effective to activate one of a plurality of devices in turn, and on energization of the system only one section thereof is rendered operative and the other section or sections are prevented from operating. As described, the switching system can be used to selectively connect oscillators to the frequency converter of a superheterodyne receiver so that the receiver will operate on different channels. The switching action stops when a signal is received on the channel which is operative. Priority can be afforded to a particular channel by causing the system to sample this channel intermittently during reception of another channel, and the system remains on the priority channel when a signal is present thereon. The system includes a starting circuit which causes the switching action to start automatically as soon as the system is energized so that a manual start operation is not required.

What is claimed is:

1. A radio receiver of the superheterodyne type including in combination, frequency converting means having a plurality of oscillator portions operative to provide reception on different channels, switching means having a plurality of sections each including a switching device individually coupled to one of said oscillator portions to operate the same, starting means connected to said switching device of a particular section for initially rendering such device conducting, each of said sections having trigger means for receiving pulses to cause said switching device thereof to change from a non-conducting to a conducting condition, said trigger means of at least one section other than said particular section being coupled to an adjacent section and being disabled when said switching device of said adjacent section is nonconducting, pulsing means connected to said trigger means for applying recurring pulses thereto, and means responsive to reception of a carrier wave by the receiver for disabling said pulsing means to thereby terminate the switching action so that the operative oscillator portion is held operative.

2. A radio receiver in accordance with claim 1 including a plurality of indicator means individually coupled to said sections and to said means responsive to reception of a carrier wave for indicating the channel on which a carrier wave is being received.

3. A radio receiver in accordance with claim 1 including means for providing recurring sampling signals coupled to said switching means to intermittently operate a predetermined one of said sections during operation of another section, to thereby receive a carrier on the channel selected by the oscillator portion coupled to said predetermined switching section.

4. A radio receiver in accordance with claim 3 wherein said pulsing means includes a unijunction transistor having a gate electrode and a capacitor connected thereto and first means for charging said capacitor controlled by said means responsive to the reception of a carrier wave, and second means for charging said capacitor controlled by said means for providing recurring sampling signals.

5. A radio receiver in accordance with claim 1 wherein said switching devices are silicon controlled rectifiers, and said pulsing means includes a unijunction transistor and a charging circuit for rendering said unijunction transistor conductive to produce triggering pulses.

6. A radio receiver in accordance with claim 5 wherein said means responsive to the reception of a carrier wave includes a capacitor and a transistor for controlling the charging voltage applied to said capacitor, and means coupling said capacitor to said charging circuit for said unijunction transistor.

7. A switching system for selectively applying a predetermined potential to a plurality of terminals, said switching system having a plurality of sections individually connected to said terminals and each including a semiconductor switching device for connecting the associated terminal to said predetermined potential, each of said sections having trigger means for receiving pulses to cause said switching device thereof to change from a non-conducting to a conducting condition, said trigger means of each section being coupled to an adjacent section and being disabled when said switching device of said adjacent section is non-conducting, pulsing means connected to said trigger means for applying recurring pulses thereto, and starting means coupled to said switching device of a particular section for applying a pulse thereto upon energization of said switching system to initially render such device conducting.

8. A system in accordance with claim 7 wherein said semiconductor switching devices are silicon controlled rectifiers.

9. A system in accordance with claim 8 wherein said trigger means of each section includes a diode for applying pulses to the gate electrode of the silicon controlled rectifier of such section, and means connecting said diode to the anode of the silicon controlled rectifier of said adjacent section for holding said diode non-conducting when said silicon controlled rectifier of said adjacent section is non-conducting.

10. A switching system in accordance with claim 7 including potential supply means for energizing the switching system, and wherein said starting circuit includes a silicon controlled rectifier connected in series with a resistor across said potential supply means, and means connecting the gate electrode of said silicon controlled rectifier to said potential supply means to render said rectifier conducting upon energization of the switching system to produce a pulse across said resistor.

References Cited

UNITED STATES PATENTS

| | | | |
|---|---|---|---|
| 2,971,155 | 2/1961 | Hurvitz | 325—334 |
| 2,994,766 | 8/1961 | McCoy | 325—334 |
| 3,020,399 | 2/1962 | Hollis | 325—322 |
| 3,113,293 | 12/1963 | Breese et al. | 307—133 |
| 3,307,106 | 2/1967 | Reindle | 325—322 |
| 3,321,708 | 5/1967 | Olson | 325—322 |

ROBERT L. GRIFFIN, Primary Examiner

ALBERT J. MAYER, Assistant Examiner

U.S. Cl. X.R.

307—133, 252, 284; 325—31, 322, 334; 331—172; 343—206